US011545809B2

(12) United States Patent
Babaei et al.

(10) Patent No.: US 11,545,809 B2
(45) Date of Patent: Jan. 3, 2023

(54) LASER LIGHT SOURCE UNIT, AND METHOD FOR GENERATING LASER LIGHT FOR VEHICLES

(71) Applicant: Hella GmbH & Co. KGaA, Lippstadt (DE)

(72) Inventors: Hanieh Babaei, Delmenhorst (DE); Julien Hansen, Witten (DE); Lukas Pörtner, Witten (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 0 days.

(21) Appl. No.: 16/764,633

(22) PCT Filed: Nov. 29, 2017

(86) PCT No.: PCT/EP2017/080846
§ 371 (c)(1),
(2) Date: May 15, 2020

(87) PCT Pub. No.: WO2019/105546
PCT Pub. Date: Jun. 6, 2019

(65) Prior Publication Data
US 2020/0335930 A1  Oct. 22, 2020

(51) Int. Cl.
*H01S 3/08* (2006.01)
*H01S 3/106* (2006.01)
(Continued)

(52) U.S. Cl.
CPC ............ *H01S 3/106* (2013.01); *H01S 3/0602* (2013.01); *H01S 3/082* (2013.01);
(Continued)

(58) Field of Classification Search
CPC .... H01S 3/08086; H01S 3/0809; H01S 3/082; H01S 3/1613; H01S 3/0815; H01S 3/0816; H01S 3/2375; H01S 3/2391
See application file for complete search history.

(56) References Cited

U.S. PATENT DOCUMENTS

| 7,158,555 B2 * | 1/2007 | Momiuchi | H01S 3/08 372/69 |
| 8,995,481 B2 * | 3/2015 | Achtenhagen | H01S 3/2383 372/23 |

(Continued)

OTHER PUBLICATIONS

Müller, S., et al. "Dual Wavelength and Switchable Laser Operation of Pr3+: LiYF4 Crystals at 523 nm and 640 nm." The European Conference on Lasers and Electro-Optics. Optical Society of America, 2011.

(Continued)

*Primary Examiner* — Tod T Van Roy
(74) *Attorney, Agent, or Firm* — Husch Blackwell LLP

(57) ABSTRACT

A laser light source unit for vehicles is provided, having a resonator containing a first end mirror and a second end mirror and an active laser medium in between. The laser light source unit has a pump device for generating a pump radiation into the resonator. The pump radiation is configured such that laser light of the first wavelength, a second wavelength, and/or a third wavelength can be radiated. An intermediate mirror is configured so that the radiation of the second wavelength is reflected, and the radiation of the third wavelength is transmitted. A third end mirror is configured so that the radiation of the second wavelength is reflected. A color control module acts on the radiation of the second wavelength and/or the third wavelength so that an intensity of the stimulated emission of the radiation of the second wavelength is adjusted to the radiation of the third wavelength.

10 Claims, 1 Drawing Sheet

(51) Int. Cl.
*H01S 3/06* (2006.01)
*H01S 3/082* (2006.01)
*H01S 3/0941* (2006.01)
*H01S 3/16* (2006.01)
*F21S 41/16* (2018.01)

(52) U.S. Cl.
CPC ...... *H01S 3/08059* (2013.01); *H01S 3/08086* (2013.01); *H01S 3/09415* (2013.01); *H01S 3/1613* (2013.01); *H01S 3/1653* (2013.01); *F21S 41/16* (2018.01)

(56) References Cited

U.S. PATENT DOCUMENTS

| | | |
|---|---|---|
| 2003/0035447 A1 | 2/2003 | Scheps |
| 2007/0189343 A1* | 8/2007 | Seelert ...................... H01S 3/23 372/22 |
| 2020/0295523 A1* | 9/2020 | Drueppel ............ H01S 3/09415 |

OTHER PUBLICATIONS

Fibrich, Martin, and Helena Jelinková. "Power-scaling of Pr: YAIO3 laser operating in CW regime at 747 nm and 720 nm wavelengths." Solid State Lasers XXII: Technology and Devices. vol. 8599. International Society for Optics and Photonics, 2013.

* cited by examiner

LASER LIGHT SOURCE UNIT, AND METHOD FOR GENERATING LASER LIGHT FOR VEHICLES

CROSS REFERENCE

This application claims priority to PCT Application No. PCT/EP2017/080846, filed Nov. 29, 2017, the entirety of which is hereby incorporated by reference.

FIELD OF THE INVENTION

The invention relates to a laser light source unit for vehicles having a resonator containing a first end mirror and a second end mirror, between which an active laser medium is arranged, and having a pump device for generating a pump radiation which can be introduced via the first end mirror into the resonator, wherein the pump radiation corresponds to a first wavelength and wherein the active laser medium is configured such that laser light of the first wavelength and/or of a second wavelength and/or of a third wavelength can be radiated.

The invention further relates to a lighting apparatus for vehicles.

The invention further relates to a method for generating laser light, wherein a pump radiation is coupled from outside via a first end mirror into a resonator having an active laser medium and is decoupled at a second end mirror of the same as laser light with a predefined wavelength or with a predefined wavelength range.

BACKGROUND

A laser light source unit for vehicles is known from DE 10 2015 121 693 A1, which has a resonator having a first end mirror and a second end mirror, wherein an active laser medium is arranged between the two end mirrors. The active laser medium is acted upon by means of a pump radiation emitted by a pump device, wherein the pump radiation penetrates through a first end mirror into the resonator. The opposite second end mirror consists of multiple mirror segments which have such layer thicknesses that radiation of particular wavelengths is stimulated in the active laser medium. For example, three mirror segments can be provided, wherein a first mirror segment stimulates radiation of a blue wavelength, a second mirror segment stimulates radiation of a green wavelength and a third mirror segment stimulates radiation of a red wavelength, so that a white laser light can be emitted by means of additive color mixing. The emission spectrum of the radiated laser light is fixed with the selection of the mirror segments at the second end mirror. The light color cannot be varied or altered.

SUMMARY OF THE INVENTION

It is the object of the present invention to specify a laser light source unit or respectively a lighting apparatus as well as a method for generating laser light, so that coherent and polarized laser light of different light colors can be emitted from a laser cavity.

In order to achieve this object, the invention in conjunction with the preamble of claim 1 is characterized in that an intermediate mirror and a third end mirror assigned to the same are provided, wherein the intermediate mirror is configured in such a way that the radiation of the second wavelength is reflected, and the radiation of the third wavelength is transmitted, by means of said intermediate mirror, and wherein the third end mirror is configured in such a way that the radiation of the second wavelength is reflected, a color control module is provided, which acts on the radiation of the second wavelength and/or the radiation of the third wavelength in such a way that an intensity of the stimulated emission of the radiation of the second wavelength is adjusted to the radiation of the third wavelength, or vice versa.

According to the invention, a resonator is provided, which not only has a first end mirror and a second end mirror, between which an active laser medium is arranged, so that a stimulated emission can be generated. In addition, the resonator has an intermediate mirror and a third end mirror, by means of which radiation of a predefined second wavelength or third wavelength can be divided spatially from the additional radiation so that this divided radiation can be additionally stimulated. In addition, the resonator has one or more color control modules which act(s) on the pump radiation or respectively the stimulated radiation of the second wavelength and third wavelength in such a way that radiation of a predefined wavelength or respectively wavelength spectrum (in the case of white light color or other mixed colors) is decoupled by means of the second end mirror. The intermediate mirror and the third end mirror virtually form part of an additional resonator so that, together with the main resonator, a polychromatic emission of radiation of a first wavelength, of a second wavelength and radiation of a third wavelength can be simultaneously decoupled from a laser cavity along an optical axis of the same. A light color of the emitted laser radiation can be effected through additive color mixing of the pump radiation of the first wavelength and the radiation of other wavelengths. The at least one color control module determines the spectral components of the emitted laser radiation, wherein, for example, by means of additive color mixing of blue, red and green radiation, white light can be generated for a predefined light distribution in the vehicle or a particular light color for, by way of example, a "welcome light scenario". The invention makes possible a polychromatic or monochromatic emission of light of multiple different wavelengths from a single laser cavity in a simple way. As a result, different color light signatures can advantageously be generated in a space-saving manner, so that the range of variation of a lighting design is increased. The laser light source unit advantageously has a relatively high luminance, in particular when emitting laser radiation of a white light color, so that the radiated light can, in particular, be conveyed via glass fibers. Since the laser light source unit radiates polarized light, a predefined light distribution can be realized with little effort in a vehicle headlight in combination with an upstream liquid crystal panel in an efficient manner that saves installation space. It is, in this case, advantageous that the resolution to be achieved is substantially higher than in the case of conventional matrix-LED headlights. Compared with the known laser light source units which have previously been used in headlights, the cooling effort required for the laser light source unit according to the invention is substantially lower, since the heat generation is constant irrespective of the emitted laser radiation spectrum.

According to a preferred embodiment of the invention, the intermediate mirror is arranged on the optical axis of the active laser medium, and the third end mirror is arranged outside the optical axis of the active laser medium. A partial radiation of the radiation stimulated in the active laser medium is therefore spatially separated. While the first end mirror reflects the radiation of the third wavelength (preferably red radiation), the third end mirror reflects radiation of a second wavelength (preferably green radiation). The intermediate mirror virtually serves as a beam splitter, since it acts reflectively for the radiation of the second wavelength (green radiation) and transmissively for the radiation of the third wavelength (red radiation). Since both the radiation of the second wavelength and of the third wavelength are decoupled by means of the same second end mirror, a polychromatic emission can simultaneously take place from a single laser cavity.

According to a preferred embodiment of the invention, the first end mirror and the second end mirror are configured to be highly transmissive for a radiation of a first wavelength (for example, blue radiation). Laser light of a white light color can advantageously be hereby emitted through additive color mixing with the second end mirror which is configured to be partially reflective for the radiation of the second wavelength and of the third wavelength.

According to a further development of the invention, the color control module is arranged in the optical path of the radiation of the second wavelength and/or of the third wavelength. If the color control module is located in the optical path of the radiation of the second wavelength, the stimulated emission (avalanche effect) of this radiation can be adjusted. If the color control module is located in the optical path of the radiation of the third wavelength, the stimulated emission (avalanche effect) of this radiation can be adjusted. Two color control modules can also be used in order to control both wavelengths simultaneously with respect to each other. For example, if the color control module is arranged in the optical path of the radiation of the second wavelength, an adjustment can be made to the radiation of the third wavelength and, if the color control module is arranged in the optical path of the radiation of the third wavelength, an adjustment to the radiation of the second wavelength can be made, so that two continuous types of radiation which have different wavelengths can be emitted simultaneously.

According to a further development of the invention, the color control module is configured as a birefringent medium or as a polarizing filter. This can advantageously reduce the radiation by altering the phase relation or by filtering a particular direction of polarization of the radiation passing through the color control module.

According to a further development of the invention, the active laser medium is formed from a praseodymium-doped yttrium lithium fluoride crystal material. The pump device has a laser diode that radiates the pump radiation of a blue wavelength. The active laser medium makes it possible to stimulate radiation of the second wavelength (green radiation) and of the third wavelength (red radiation), so that by means of additive color mixing with the radiation of the first wavelength (blue radiation), which is caused by the laser diode, light of a white light color can be radiated.

According to a development of the invention, at least one of the end mirrors is planar or spherical, wherein all end mirrors of the resonator can also be shaped as planar or spherical end mirrors. In a particularly preferred embodiment, the first end mirror is flat and the second and third mirror are spherical. A particularly simple adjustment of the end mirrors can thus be achieved, in order to achieve a particularly stable resonator, which thereby satisfies the best reflection properties.

In order to achieve the object, the lighting apparatus has the features of Claim 9. An upstream optical unit for generating a predefined light distribution in a headlight can, for example, comprise a liquid crystal panel, the pixels of which can be individually controlled so that, for example, a dynamic full beam distribution with dimmed regions can be generated in the light distribution in order to avoid dazzling other road users.

In order to achieve the object, a method according to the invention has the features of Claim 10. Advantageously, a radiation of a particular wavelength can be deflected out of the optical path of the pump radiation and then deflected back in by means of an intermediate mirror and a third end mirror. As a result, two separate optical paths are created for radiation of a different wavelength. In particular, a polychromatic emission of multiple wavelengths can be advantageously provided from a single laser cavity.

BRIEF DESCRIPTION OF THE DRAWINGS

Reference is now made more particularly to the drawings, which illustrate the best presently known mode of carrying out the invention and wherein similar reference characters indicate the same parts throughout the views.

DETAILED DESCRIPTION OF THE DRAWINGS

Figure 1:
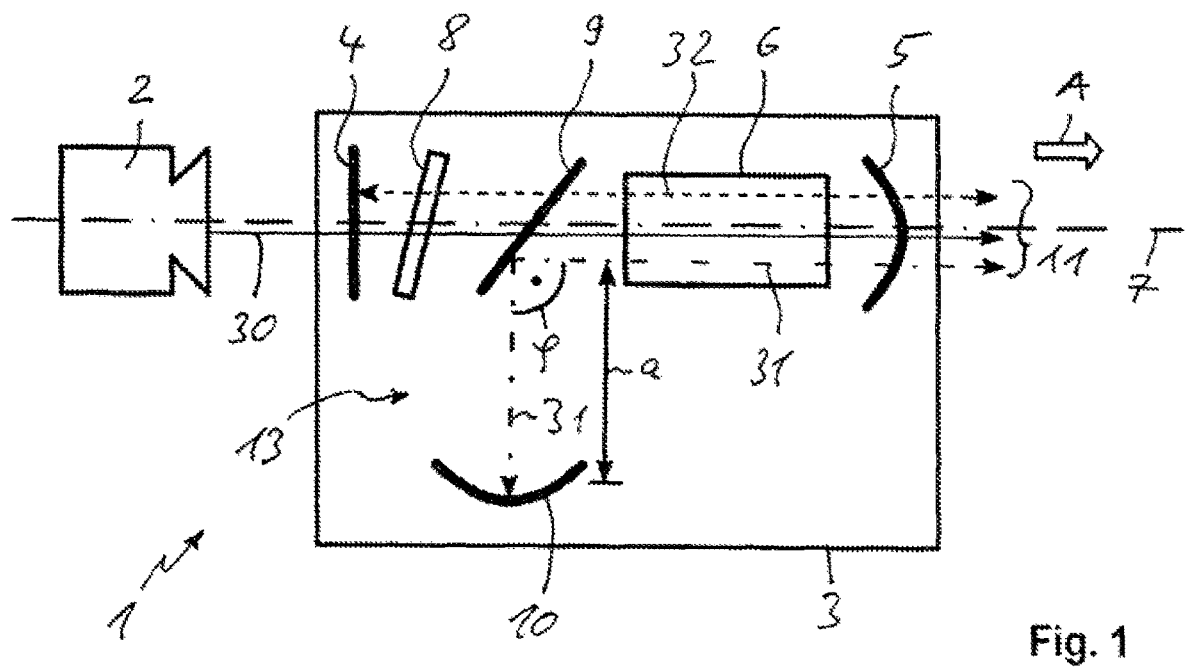
FIG. 1 shows a schematic construction of a laser light source unit according to the invention.

A laser light source unit 1 according to the invention is preferably used in vehicles, in particular in headlights, for generating predefined light distributions. Alternatively, the laser light source unit 1 can also be used in other lights for identification inside or outside the vehicle, or for other purposes.

The laser light source unit 1 has a pump device 2 for generating a pump radiation 30. The pump device 2 can comprise a laser diode that emits light of a first wavelength in order to form the pump radiation 30 (blue light).

Furthermore, the laser light source unit 1 has a resonator 3 which is assigned to the pump device 2. The resonator 3 has a first end mirror 4 on one side facing the pump device 2 and a second end mirror 5 on a side facing away from the pump device 2. An active laser medium 6 is arranged between the first end mirror 4 and the second end mirror 5 which, in the present embodiment example, consists of a praseodymium-doped crystal material, namely praseodymium-doped yttrium lithium fluoride crystal material ($Pr^{3+}$: YLF). The first end mirror 4 serves as a coupling-in mirror for the pump radiation 30. The first end mirror 4 has, for example, a planar configuration. The second end mirror 5 serves as a decoupling mirror of the laser light source unit 1 for decoupling the light in the radiation direction A. This has a spherical configuration in this embodiment example.

The radiated pump radiation 30 is coupled into the resonator 3 via the first end mirror 4 and is focused by means of lenses, which are not shown, onto the active laser medium 6.

In addition, a color control module 8 as well as an intermediate mirror 9 of an additional resonator 13 are arranged along an optical axis 7 of the laser light source unit 1, which extends along a direction of the pump radiation 30 and between the first end mirror 4 and the second end mirror 5. A third end mirror 10 of the additional resonator 13 is located outside the optical axis 7. The intermediate mirror 9 is arranged oriented towards the optical axis 7 in such a way that a radiation with a predefined wavelength is deflected at a deflection angle φ with respect to the laterally arranged third end mirror 10. The deflection angle φ in the present embodiment example is equal to 90°. In the present embodiment example, the color control module 8 is arranged between the first end mirror 4 and the active laser medium 6 or respectively the intermediate mirror 9 of the additional resonator 13. The intermediate mirror 9 is arranged between the first end mirror 4 or respectively the color control module 8 and the active laser medium 6. According to an alternative embodiment of the invention (not shown), the intermediate mirror 9 and/or the color control module 8 can also be arranged between the active laser medium 6 and the second end mirror 5. Another additional color control module can also be positioned between the intermediate mirror 9 and the third end mirror 10.

Figure 2:
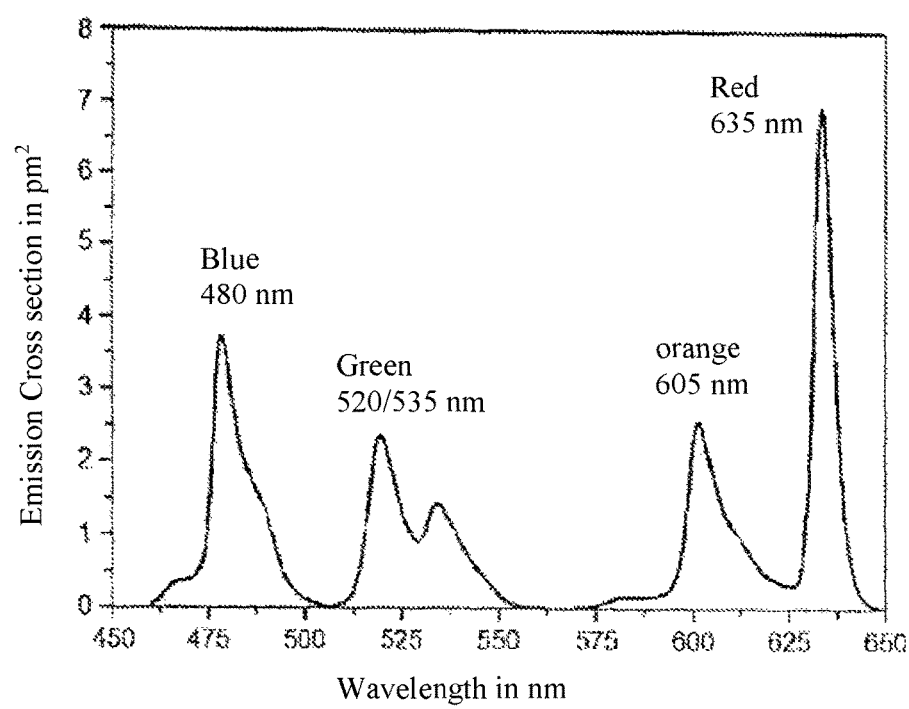
FIG. 2 shows a representation of an emission spectrum of the active laser medium.

The emission cross-section of the active laser medium 6 as a function of the wavelength is shown in FIG. 2. Thanks to a corresponding stimulated emission, the laser light source unit 1 is therefore in a position to emit laser light 11 of a white light color in the radiation direction A. The white laser light 11 substantially consists of radiation 30 of a first wavelength (blue radiation), radiation 31 of a second wavelength (green radiation) and radiation 32 of a third wavelength (red radiation).

FIG. 1 shows the spectral radiation components 30, 31, 32 which, by means of additive color mixing, generate the white or any other mixed color of laser light 11. The blue pump radiation 30 serves to excite the active laser medium 6 which is to be used for the generation of the green radiation 31 and the red radiation 32.

The first end mirror 4 and the second end mirror 5 are configured to be highly transmissive for the radiation of the first wavelength (blue radiation). In this way, it is ensured that the blue radiation 30 can be decoupled as a component of the laser light 11 from the laser light source 1 by means of the second end mirror 5. The first end mirror 4 is configured to be highly reflective for the radiation of the third wavelength (red radiation) so that the excited red radiation 32 is constantly reflected in the direction of the second end mirror 5. The second end mirror 5 is configured to be partially reflective for the radiation 32 of the third wavelength (red radiation) so that the red radiation 32 can be decoupled from the laser light source unit 1, To this end, the second end mirror 5 has a reflectance in the range of 96% to 100%.

The first end mirror 4 has a transmittance in the range of 100% or just below 100% (close to 100%) for the first wavelength 30.

The first end mirror 4 has a reflectance of 100% or just below 100% (close to 100%) for the radiation 32 of the third wavelength.

The intermediate mirror 9 is configured to be transmissive with respect to the radiation 32 of the third wavelength (red radiation), the transmittance for this wavelength is preferably 100% or respectively just below 100% (close to 100%). With respect to the radiation 31 of the second wavelength (green radiation 31), the intermediate mirror 9 is configured to be highly reflective, for example, a reflectance of 100% or just below 100%. The intermediate mirror 9 is configured in such a way that the radiation 31 of the second wavelength is exclusively reflected to the side, and indeed at the right angle of deflection φ to the third end mirror 10. The third end mirror 10 is configured to be highly reflective with respect to the radiation 31 of the second wavelength (reflectance of 100% or just below 100%) so that the green radiation 31 is reflected back to the intermediate mirror 9.

Since the second end mirror 5 is configured to be partially reflective for the radiation 31 of the second wavelength and the radiation 32 of the third wavelength, preferably equally partially reflective, and indeed in the range of 96% to 100% of reflectance, the laser light 11 can be generated by additive color mixing of the blue radiation 30, the green radiation 31 and the red radiation 32.

With respect to the radiation 31 of the second wavelength, the intermediate mirror 9 and the third end mirror 10 as well as the second end mirror 5 form the additional resonator 13, which ensures that the radiation 31 of the second wavelength can be decoupled as a spectral component of the laser light 11.

The color control module 8 can have a birefringent medium or a polarizing filter, by means of which radiation 32 of the third wavelength passing through them can be adjusted to the radiation 31 of the second wavelength. In the present exemplary embodiment, the radiation 32 of the third wavelength is adjusted with respect to the degree of the generated avalanche effect such that the enhancement, i.e. the avalanche effect of the green radiation 31, corresponds to the enhancement of the red radiation 32. In this way, all three basic components RGB which are necessary for the white laser light 11 can be generated by means of stimulated emission of the two wavelengths 32 and 31 as well as with the blue radiation 30.

According to an alternative embodiment (not shown) of the invention, the color control module 8 can also be arranged within an optical path of the green radiation 31, for example between the intermediate mirror 9 and the third end mirror 10. In this way, the intensity of the green radiation 31 could be adjusted to the intensity of the red radiation 32. Consequently, according to one construction of the laser light source unit 1 according to the invention, not only can the color control module 8 be arranged between the first end mirror 4 and the intermediate mirror 9, but also additionally or alternatively between the intermediate mirror 9 and the third end mirror 10.

In the present exemplary embodiment, the color control module 8 brings about a reduction in the radiation by altering the phase relation (in the case of a birefringent material) or by filtering a particular direction of polarization (in the case of a polarizing filter) of the radiation 32 passing through the color control module 8.

In the present exemplary embodiment, the color control module 8 is configured as a birefringent crystal plate which is located at a Brewster angle to the optical axis 7. The color control module 8 has a rigid configuration—like the other components of the laser light source unit 1, but can be rotated or turned about the optical axis.

Different spectrally-dependent optical paths are provided according to the invention. While the optical path for the radiation 32 of the third wavelength runs linearly between the first end mirror 4 and the second end mirror 5, the optical path of the radiation 31 of the second wavelength is arranged in an angular form. Instead of the right-angled deflection angle φ, an acute or obtuse deflection angle φ can also be provided. It is essential that the radiation 31 of the second wavelength is guided out of the optical path of the radiation 32 of the third wavelength, or vice versa.

An optical unit (not shown) for forming the lighting apparatus is arranged in the radiation direction (A) before the laser light source unit 1. The optical unit has, for example, a liquid crystal panel having a number of pixels which are arranged in the manner of a matrix and which are individually controllable. A predefined light distribution, for example a low-beam light distribution, can be adjusted by controlling the pixels. To this end, the pixels of the liquid crystal panel are mapped by means of a subordinate lens unit into the area in front of the vehicle. If necessary, a traffic area capturing unit can be provided, which supplies sensor data regarding the existence and the location of another traffic object in the area in front of the vehicle. Depending on the current location of this traffic object, the pixels of the liquid crystal panel can then be controlled so that the region of the generated light distribution, in which the traffic object is located, is not illuminated and, therefore, a glare suppression region of the light distribution is generated. This glare suppression region can be adapted to the altered relative position of the traffic object with respect to the vehicle, so that the entire area in front of the vehicle is illuminated with the exception of the glare suppression region, in which the traffic object is currently located (glare-free full beam distribution).

The third end mirror 10 is arranged at a distance a from the optical path of the blue radiation 30 and the red radiation 32.

The color control module 8 can also be configured such that it absorbs the radiation 32 of the third wavelength, so that said spectral component is not available for the laser light 11. If necessary, an additional color control module (not shown) can also be arranged for the radiation 31 of the second wavelength and/or of the first wavelength inside or outside the resonator 3, so that the radiation 30 of the first wavelength and/or the radiation 31 of the second wavelength can be absorbed and is therefore not available for the radiated laser light 11. In this way, laser light 11 of a red or blue or green color or any other mixed color can be radiated, for example, for a welcome light function.

An additional lens device is preferably provided in the radiation direction A behind the liquid crystal panel for enlarging and for further blending the laser light 11 radiated by the laser light source unit 1.

LIST OF REFERENCE NUMERALS

1 Laser light source unit
2 Pump device
3 Resonator
4 $1^{st}$ end mirror
5 $2^{nd}$ end mirror
6 Active laser medium
7 Optical axis
8 Color control module
9 intermediate mirror
10 $3^{rd}$ end mirror
11 Laser light
13 Additional resonator
30 Pump radiation
31 Radiation
32 Radiation
a Distance
A Radiation direction
φ Deflection angle

The invention claimed is:

1. A laser light source unit for vehicles, the laser light source unit comprising:
   a resonator containing a first end mirror and a second end mirror, between which an active laser medium is arranged;
   a pump device for generating a pump radiation introduced via the first end mirror into the resonator, wherein the pump radiation corresponds to a first wavelength and wherein the active laser medium is configured such that laser light of at least one of the first wavelength, a second wavelength, and a third wavelength is radiated, wherein the radiation of the second wavelength has a first intensity and the radiation of the second wavelength has a second intensity;
   an intermediate mirror and a third end mirror assigned to the intermediate mirror, wherein the intermediate mirror is configured in such a way that the radiation of the second wavelength is reflected, and the radiation of the third wavelength is transmitted, by means of said intermediate mirror, and wherein the third end mirror is configured in such a way that the radiation of the second wavelength is reflected, wherein the intermediate mirror is arranged between the first end mirror and the active laser medium; and
   a color control module which acts on the radiation of the second wavelength and/or the radiation of the third wavelength in such a way that the first intensity is adjusted to the second intensity or vice versa,
   wherein the color control module is arranged between the first end mirror and the intermediate mirror,
   wherein the second end mirror is configured to output laser light that exits the laser light source unit, and
   the laser light outputted by the second end mirror includes the radiation of the first wavelength, the radiation of the second wavelength, and the radiation of the third wavelength.

2. The laser light source unit according to claim 1, wherein the intermediate mirror is arranged on the optical axis of the active laser medium and the third end mirror is arranged outside the optical axis of the active laser medium.

3. The laser light source unit according to claim 1, wherein the first end mirror and the second end mirror are configured to be highly transmissive for the radiation of the first wavelength, the first end mirror is configured to be highly reflective for the radiation of the third wavelength, and the second end mirror is configured to be partially reflective for the radiation of the second wavelength and the radiation of the third wavelength.

4. The laser light source unit according to claim 1, wherein the color control module is arranged in the optical path of the radiation of the second wavelength and/or the radiation of the third wavelength.

5. The laser light source unit according to claim 1, wherein the radiation of the second wavelength and/or the radiation of the third wavelength passing through the color control module is/are reduced or enhanced by rotating the color control module.

6. The laser light source unit according to claim 1, wherein the color control module comprises a birefringent medium or a polarizing filter or a neutral density filter.

7. The laser light source unit according to claim 1, wherein the active laser medium consists of a praseodymium-doped yttrium lithium fluoride crystal material and that the pump device has a laser diode that radiates the pump radiation of a blue wavelength as the first wavelength.

8. The laser light source unit according to claim 1, wherein the first end mirror has a planar configuration and the second end mirror has a spherical configuration.

9. A lighting apparatus for vehicles having a laser light source unit according to claim 1, comprising:
   an upstream optical unit in an output direction of the pump device for generating a predefined light distribution.

10. A method for generating laser light, wherein a pump radiation of a first wavelength is coupled from outside via a first end mirror into a resonator having an active laser medium and is decoupled at a second end mirror of the same as laser light with a predefined wavelength or with a predefined wavelength range, the method comprising the steps of:
- generating a radiation of a second wavelength in the active laser medium that is exclusively deflected at an intermediate mirror out of the optical path of the pump radiation in the direction of a third end mirror arranged at a distance from the optical path of the pump radiation, at which third end mirror the radiation of the second wavelength is reflected in the direction of the intermediate mirror;
- generating a radiation of the third wavelength in the active laser medium that is transmitted at the intermediate mirror in the direction of the first end mirror or in the direction of the second end mirror;
- adjusting an intensity of the radiation of the second wavelength by use of a color control module, the color control module arranged between the first end mirror and the intermediate mirror; and
- generating laser light including the radiation of the first wavelength, the radiation of the second wavelength, and the radiation of the third wavelength by additive color mixing,
- wherein the laser light exits the resonator through the second mirror.

* * * * *